(12) United States Patent
Wang et al.

(10) Patent No.: US 11,043,417 B2
(45) Date of Patent: *Jun. 22, 2021

(54) LINE STRUCTURE FOR FAN-OUT CIRCUIT AND MANUFACTURING METHOD THEREOF, AND PHOTOMASK PATTERN FOR FAN-OUT CIRCUIT

(71) Applicant: MACRONIX International Co., Ltd., Hsinchu (TW)

(72) Inventors: Wei-Hung Wang, Taipei (TW); Chih-Hao Huang, Hsinchu Country (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/439,499

(22) Filed: Jun. 12, 2019

(65) Prior Publication Data
US 2020/0395239 A1 Dec. 17, 2020

(51) Int. Cl.
*H01L 21/768* (2006.01)
*H01L 21/027* (2006.01)
*H01L 23/482* (2006.01)
*H01L 23/528* (2006.01)

(52) U.S. Cl.
CPC ...... *H01L 21/7688* (2013.01); *H01L 21/0272* (2013.01); *H01L 21/76895* (2013.01); *H01L 23/4824* (2013.01); *H01L 23/528* (2013.01)

(58) Field of Classification Search
CPC ............... H01L 23/4824; H01L 23/528; H01L 21/7688; H01L 21/0272; H01L 21/0338; H01L 2224/49171
See application file for complete search history.

(56) References Cited

U.S. PATENT DOCUMENTS

| 7,838,996 | B2 * | 11/2010 | Sato | H01L 27/0203 257/775 |
| 9,773,753 | B1 * | 9/2017 | Lin | H01L 23/5389 |
| 10,497,566 | B1 * | 12/2019 | Yang | H01L 21/76877 |
| 2016/0099217 | A1 * | 4/2016 | Peng | H01L 21/31111 257/797 |

FOREIGN PATENT DOCUMENTS

TW  201820580  6/2018

OTHER PUBLICATIONS

"Office Action of Taiwan Counterpart Application," dated Sep. 9, 2019, p. 1-p. 4.

* cited by examiner

*Primary Examiner* — Phat X Cao
(74) *Attorney, Agent, or Firm* — J.C. Patents

(57) ABSTRACT

A line structure for fan-out circuit having a dense-line area and a fan-out area is provided. The line structure includes a plurality of dense lines arranged in the dense-line area parallel to a first direction, a plurality of pads disposed in the fan-out area, and a plurality of connecting lines arranged in the fan-out area parallel to a second direction. The connecting lines respectively connect one of the dense lines with one of the pads, wherein at least one of the connecting lines is a wavy line.

6 Claims, 13 Drawing Sheets

LINE STRUCTURE FOR FAN-OUT CIRCUIT AND MANUFACTURING METHOD THEREOF, AND PHOTOMASK PATTERN FOR FAN-OUT CIRCUIT

BACKGROUND

Technical Field

The disclosure relates to a line structure for fan-out circuit, a manufacturing method thereof, and a photomask pattern for fan-out circuit.

Description of Related Art

Lines for a fan-out circuit connect an array pattern of dense lines of word lines in a memory array to a pad pattern of pads.

The lines in a typical fan-out circuit includes a dense-line area having a plurality of dense lines and a fan-out area connected to pads. As the line density increases and miniaturization of component progresses, the line spacing and line width in the dense-line area are also greatly reduced. In order to ensure the resolution of the dense-line area in the exposure process, a light source having a large light intensity in a single direction (vertical to the extending direction of the dense lines) is used for exposure. However, such exposure method causes a problem in semi-iso line exposure at the junction of the dense-line area and the fan-out region, and thus impacting the process window. Since the semi-iso line is only adjacent to other dense lines on one side, the light intensity in the direction vertical to the extending direction of the dense lines is greater than other dense lines, the photoresist is collapsed and cannot be formed.

Although studies for improving photomask patterns have been proposed, due to optical interference and diffraction, there have been problems such as photoresist peeling or print out problem of dummy patterns.

SUMMARY

The disclosure provides a line structure for fan-out circuit, which is a line structure manufactured by a lithography process having a large process window without forming dummy patterns.

The disclosure further provides a manufacturing method of a line structure for fan-out circuit, which can achieve a large process window without forming dummy patterns.

The disclosure further provides a photomask pattern for fan-out circuit, which can keep the formation of the semi-iso line.

A line structure for fan-out circuit of the disclosure includes a plurality of dense lines, a plurality of pads and a plurality of connecting lines. The fan-out circuit has a dense-line area and a fan-out area. The dense lines are arranged in the dense-line area parallel to the first direction, the pads are located in the fan-out area, and the connecting lines are arranged in the fan-out area parallel to the second direction, and respectively connect one of the dense lines with one of the pads, wherein at least one of the connecting lines is a wavy line.

In an embodiment of the disclosure, the shape of the wavy line in the two adjacent connecting lines is mirror symmetrical.

In an embodiment of the disclosure, the shape of the wavy line in the two adjacent connecting lines is asymmetrical.

In an embodiment of the disclosure, the minimum distance between the two adjacent connecting lines is between 150 nm and 200 nm.

In an embodiment of the disclosure, the pitch of the wavy line is between 70 nm and 90 nm.

In an embodiment of the disclosure, the amplitude of the wavy line is between 20 nm and 40 nm.

A manufacturing method of a line structure for fan-out circuit of the disclosure includes forming a sacrificed layer on a conductive layer, and then forming a patterned photoresist layer on the sacrificed layer, the patterned photoresist layer includes a plurality of first linear patterns arranged in the dense-line area parallel to the first direction and a plurality of second linear patterns arranged in the fan-out area parallel to the second direction, at least one side of the second linear patterns has a wavy side profile. Then, the first linear patterns and the second linear patterns are transferred to the sacrificed layer to form a plurality of first lines and a plurality of second lines and expose the conductive layer, wherein at least one sidewall of the second liens is wavy. A spacer is formed on the sidewall of each of the first lines and the sidewall of at least one of the second lines, and the first line and the second line are removed. By using the spacer as mask, the exposed conductive layer is etched, such that the conductive layer becomes the plurality of dense lines in the dense-line area and the plurality of connecting lines in the fan-out area, wherein at least one of the connecting lines is a wavy line.

In another embodiment of the disclosure, the method of forming the above-described patterned photoresist layer includes using an exposure light source having a higher intensity in the second direction than the intensity in the first direction.

In another embodiment of the disclosure, the first direction is perpendicular to the second direction.

In another embodiment of the disclosure, after the first line and the second line are removed, a plurality of pads may be formed in the fan-out area and respectively connected to the connecting lines.

A photomask pattern for a fan-out circuit of the disclosure includes a main pattern and an assistant pattern. The fan-out circuit has a dense-line area and a fan-out area. The main pattern includes a plurality of strip patterns arranged in the dense-line area parallel to a first direction and a plurality of connecting patterns arranged in the fan-out area parallel to a second direction for connecting each of the strip patterns. The assistant pattern is disposed in a region among one of the strip patterns and two of the adjacent connecting patterns, wherein the assistant pattern includes a plurality of line patterns parallel to the second direction, and the line patterns are in direct contact with the one of the strip patterns.

In yet another embodiment of the disclosure, a spacing between the plurality of line patterns is 30 nm to 50 nm.

In yet another embodiment of the disclosure, a spacing between one of the connecting patterns and the adjacent line is 40 nm to 80 nm.

In yet another embodiment of the disclosure, a length of each of the line patterns is 200 nm to 240 nm.

In yet another embodiment of the disclosure, a width of each of the line patterns is 18 nm to 24 nm.

In yet another embodiment of the disclosure, the main pattern further includes a plurality of block patterns arranged in the fan-out area parallel to the second direction, and each of the connecting patterns connects each of the strip patterns with each of the block patterns.

In yet another embodiment of the disclosure, the assistant pattern is disposed in the region among one of the strip patterns, two of the adjacent block patterns, and two of the adjacent connecting patterns.

In yet another embodiment of the disclosure, a width of each of the block patterns is larger than a width of each of the connecting patterns.

In yet another embodiment of the disclosure, the assistant pattern further includes a plurality of additional line patterns parallel to the second direction, each of the additional line patterns is between the line patterns, and the additional line patterns are not in contact with the one of the strip patterns.

In yet another embodiment of the disclosure, portions of the additional line patterns are in contact with two of the adjacent block patterns.

Based on the above, according to the disclosure, the process window for the line manufacturing process in fan-out circuit can be extended by the photomask patterns with special design, thereby forming the lines having a specific topography to connect the pads in the fan-out area with the dense lines in the dense-line area. Meanwhile, since the process window is large, the problem of peeling or print out in photoresist is less likely to occur, thereby preventing the formation of dummy patterns in the structure.

To make the aforementioned more comprehensible, several embodiments accompanied with drawings are described in detail as follows.

DESCRIPTION OF EMBODIMENTS

Different embodiments or examples are provided in the following content for implementing different features of the disclosure. Moreover, the examples are merely exemplary and are not intended to limit the scope and application of the disclosure. Furthermore, for clarity, the relative dimensions (e.g., length, thickness, spacing, etc.) and relative positions of various regions or structural elements may be reduced or enlarged. In addition, similar or identical reference symbols are used in the various drawings to indicate similar or identical elements or features.

Figure 1:
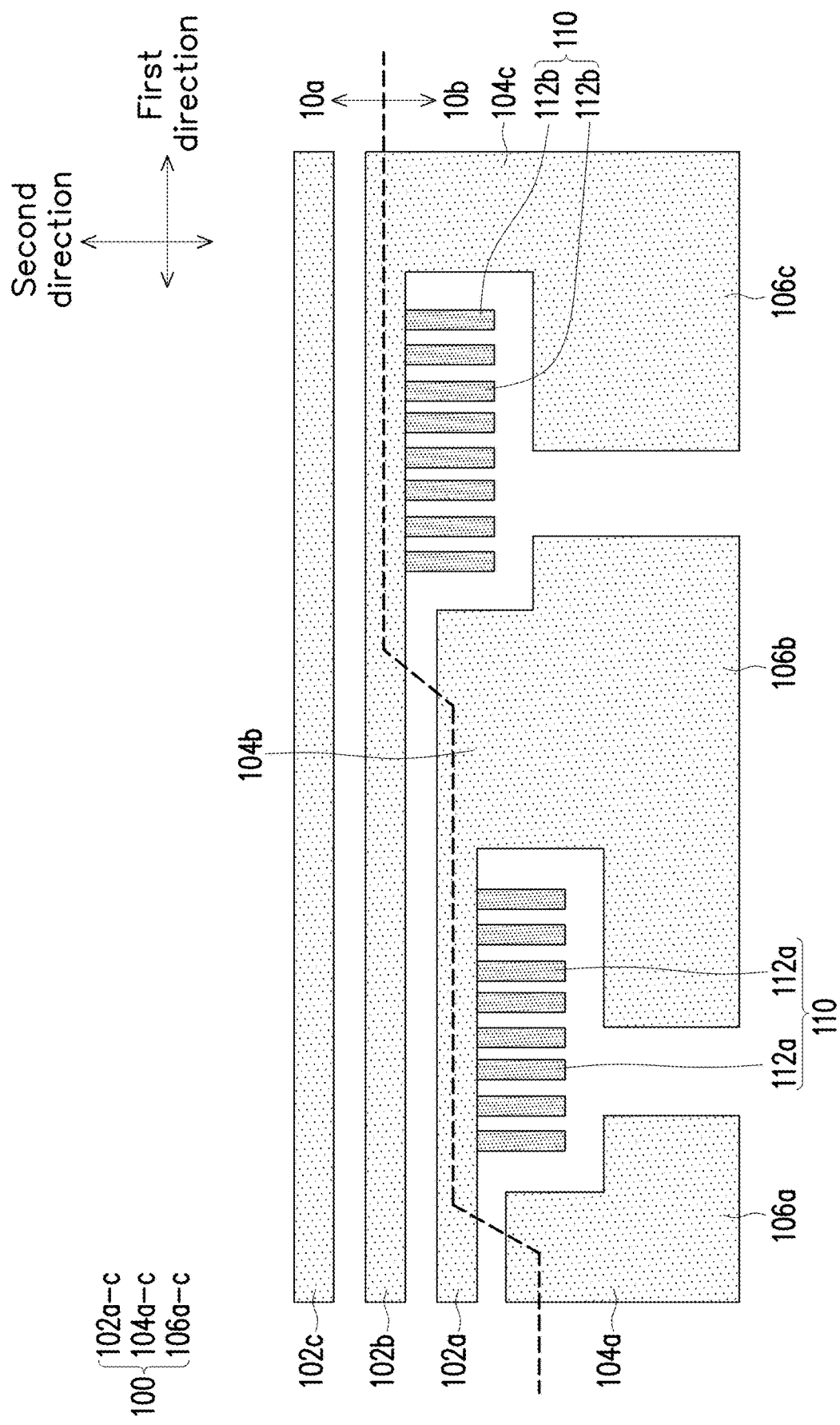
FIG. 1 is a schematic view showing the layout of a photomask pattern according to a first embodiment of the disclosure.

FIG. 1 is a schematic view showing the layout of a photomask pattern according to a first embodiment of the disclosure.

Referring to FIG. 1, a photomask pattern of the present embodiment is used for fan-out circuit, and the fan-out circuit typically includes a dense-line area 10a and a fan-out area 10b. In order to simultaneously ensure the resolution of the dense-line area 10a and the overall process window, an assistant pattern 110 is added to the photomask pattern.

In an embodiment, the main pattern 100 of the photomask pattern includes a plurality of strip patterns 102a, 102b, 102c arranged in the dense-line area 10a parallel to a first direction and a plurality of second connecting patterns 104a, 104b, 104c arranged in the fan-out area 10b parallel to a second direction, and each of the connecting patterns is connected to one strip pattern, for example, the connecting pattern 104b is connected to the strip pattern 102a, the connecting pattern 104c is connected to the strip pattern 102b, and so on. The first direction is different from the second direction, for example, the first direction is perpendicular to the second direction. In another embodiment, if the line is to be prolonged, the main pattern 100 may further include a plurality of block patterns 106a, 106b, 106c arranged in the fan-out area 10b parallel to the second direction, and the width of each of the block patterns 106a, 106b, 106c is generally larger than the width of the connecting patterns 104a, 104b, 104c. The above connecting patterns connect one strip pattern with one block pattern; for example, the connecting pattern 104b connects the strip pattern 102a with the block pattern 106b, the connecting pattern 104c connects the strip pattern 102b with the block pattern 106c, and so on.

The assistant pattern 110 is formed of a plurality of line patterns 112a, 112b parallel to the second direction, and the assistant pattern 110 is respectively disposed in an area between one strip pattern and two adjacent connecting patterns. For example, the line pattern 112a is disposed in an area between the strip pattern 102a and the two adjacent connecting patterns 104a and 104b, the line pattern 112b is disposed in an area disposed between the strip pattern 102b and the two adjacent connecting patterns 104b and 104c, and so on. Moreover, the line patterns 112a, 112b in the assistant pattern 110 directly contacts a strip pattern; for example, each of the strip patterns 112a directly contacts the strip pattern 102a, each of the line patterns 112b directly contacts the strip pattern 102b, and so on.

In another embodiment, if the main pattern 100 further includes block patterns 106a, 106b, 106c, the assistant pattern 110 is disposed in an area between one strip pattern, two adjacent connecting patterns and two adjacent block patterns. For example, the line pattern 112a is disposed in an area between the strip pattern 102a, the two adjacent connecting patterns 104a and 104b and the two adjacent block patterns 106a and 106b, the line pattern 112b is disposed in an area between the strip pattern 102b, the two adjacent connecting patterns 104b and 104c and the two adjacent block patterns 106b and 106c, and so on.

Figure 2:
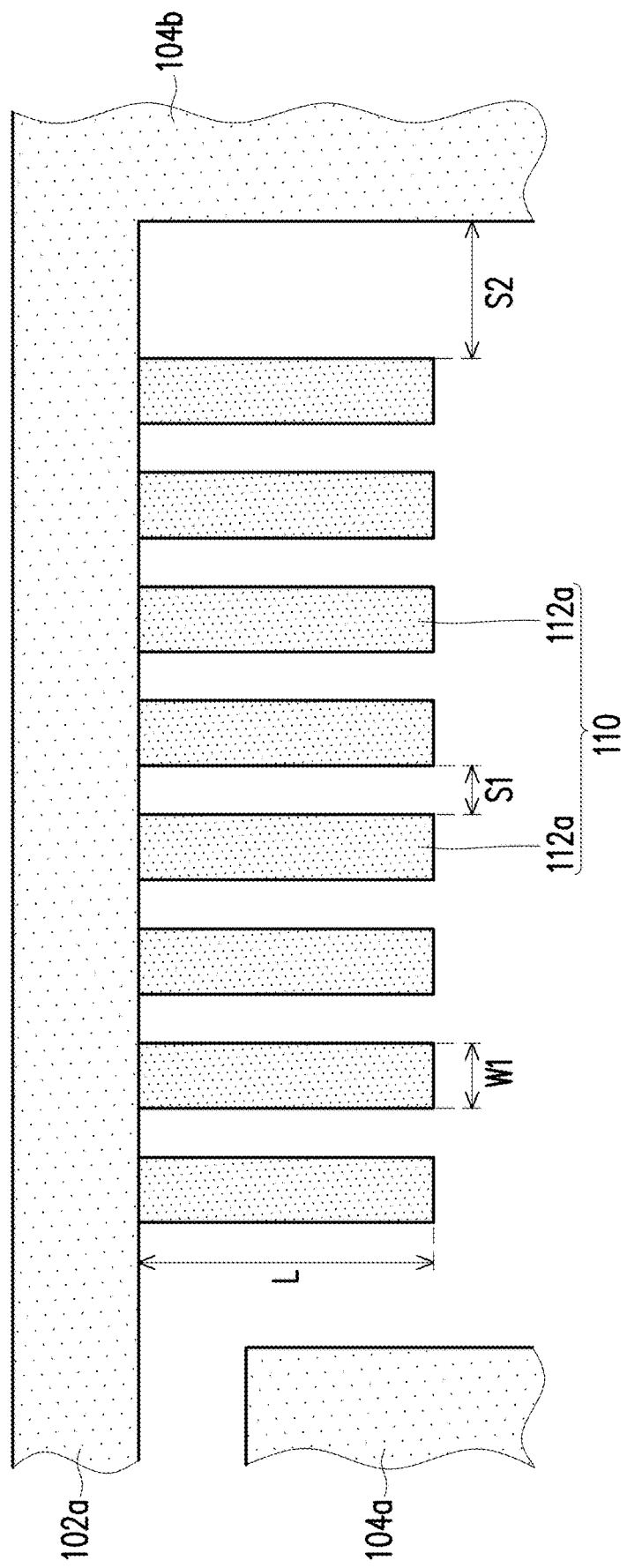
FIG. 2 is a partial enlarged view of FIG. 1.

FIG. 2 is a partial enlarged view (of the line pattern 112a in the assistant pattern 110) of FIG. 1. In FIG. 2, the length L of the line pattern 112a in the assistant pattern 110 is, for example, between 200 nm and 240 nm, and the width W1 of the line pattern 112a in the assistant pattern 110 is, for example, between 18 nm and 24 nm, and the spacing S1 between the line pattern 112a in the assistant pattern 110 is, for example, between 30 nm and 50 nm, and the spacing S2 between the line pattern 112a and the adjacent connecting pattern 104a (or 104b) is, for example, between 40 nm and 80 nm, but the disclosure is not limited thereto. The size design of the assistant pattern 110 may vary according to different component size designs.

Figure 3:
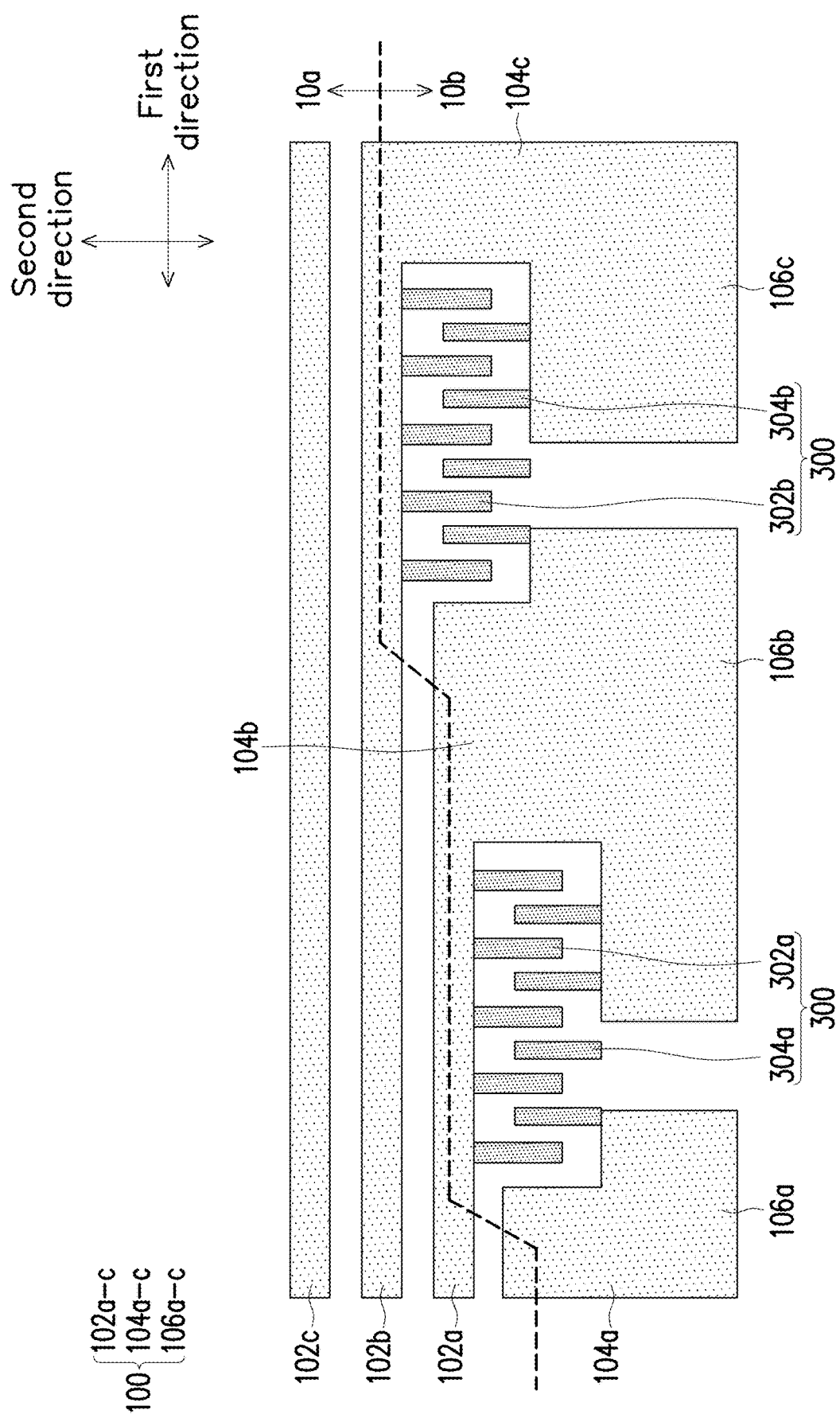
FIG. 3 is a schematic view showing the layout of another photomask pattern of the first embodiment.

FIG. 3 is a schematic view showing the layout of another photomask pattern of the first embodiment, wherein the same or similar components are denoted by the reference signs in FIG. 1, and the description of the same components can be derived from the above first embodiment, and thus related descriptions are omitted herein.

In FIG. 3, the assistant pattern 300 not only includes the line patterns 302a, 302b, but also includes additional line patterns 304a and 304b. The positions of the line patterns 302a, 302b are similar to the line patterns 112a, 112b of FIG. 1, and the line patterns 302a, 302b are in direct contact with the strip patterns 102a, 102b. The additional line pattern 304a is arranged between the line pattern 302a parallel to the second direction, and the additional line pattern 304b is arranged between the line pattern 302b parallel to the second direction. Moreover, the additional line patterns 304a, 304b do not contact the strip patterns 102a, 102b. That is, the assistant pattern 300 is composed of staggered line pattern 302a (or 302b) and additional line pattern 304a (or 304b). In addition, the additional line patterns 304a, 304b in the assistant pattern 300 may directly contact two adjacent block patterns; for example, one additional line pattern 304a is in direct contact with the block pattern 106a, some additional line patterns 304a are in direct contact with the block pattern 106b; one additional line pattern 304b is in direct contact with the block pattern 106b, some additional line patterns 304b are in direct contact with the block pattern 106c, and so on. However, the disclosure is not limited thereto, and the additional line patterns 304a, 304b may not be in contact with surrounding patterns.

Figure 4:
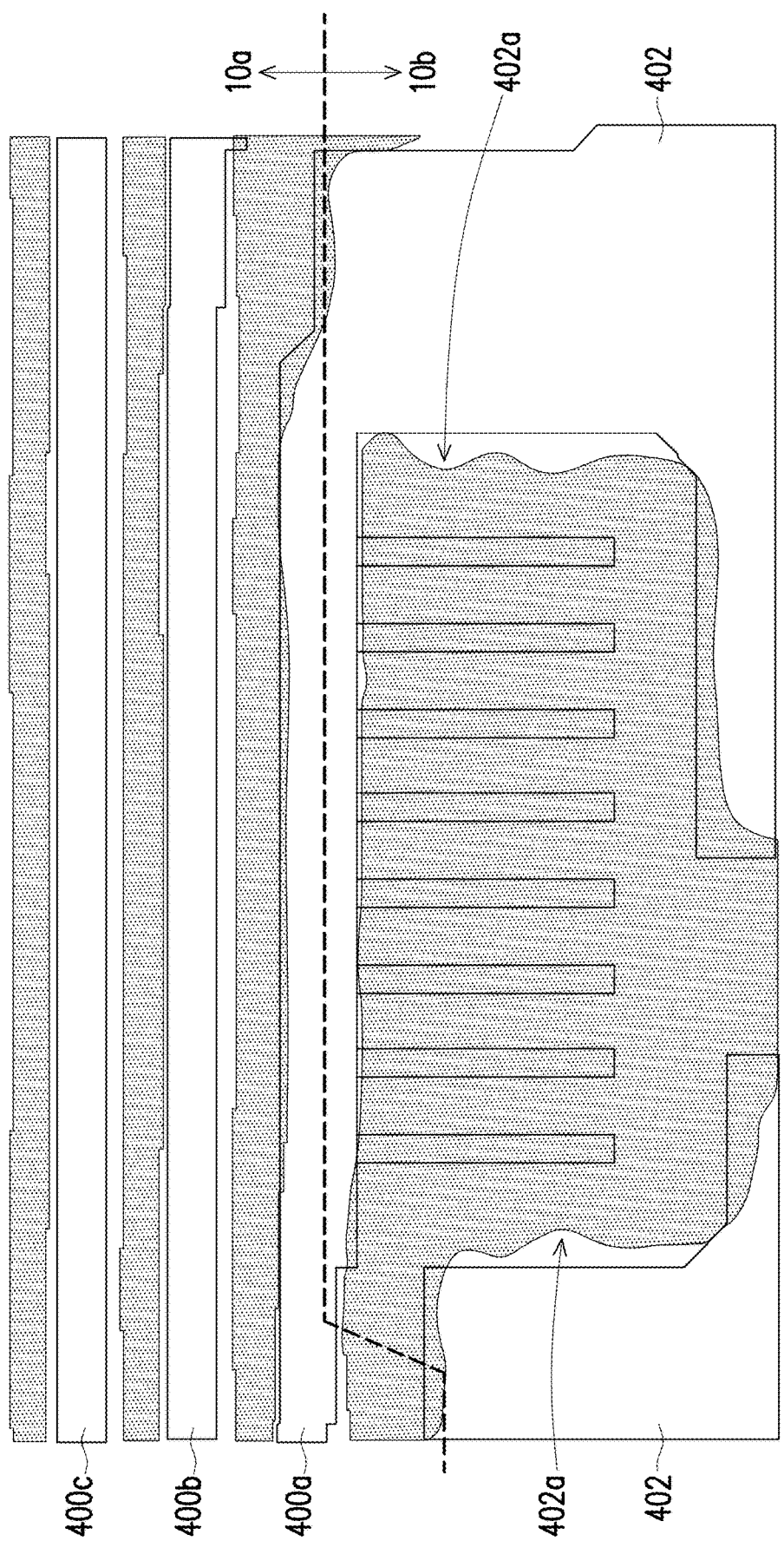
FIG. 4 is a photomask pattern and a simulation of a photoresist pattern after exposure and development according to the first embodiment.

The photomask pattern and a simulation of a photoresist pattern after exposure and development according to the first embodiment are shown in FIG. 4, wherein the lines represent contours of the photomask pattern similar to that of FIG. 1, the area drawn with dots represents the simulated photoresist-free pattern, and the blank area represents the simulated photoresist pattern. It can be seen from FIG. 4 that exposure and development are performed by using the photomask pattern of the first embodiment, thereby obtaining a photoresist pattern having a plurality of first linear patterns 400a, 400b, 400c in the dense-line area 10a and a plurality of second linear patterns 402 in the fan-out area 10b, wherein each of the second linear pattern 402 has a wavy side profile 402a.

Since the photomask pattern has a comb pattern consisting of the strip pattern and the assistant pattern contacting the strip pattern (e.g., 102a and 112a in FIG. 1), when the exposure is performed by using the light source having a large light intensity in a single direction (e.g., second direction), such comb pattern can solve the problem of exposing in a direction in which the light intensity is strong (such as the second direction), thereby increasing the process window. Specifically, if there is no assistant pattern, since the light intensity for exposure in the second direction is too strong, the first linear pattern 400a closest to the boundary between the dense-line area 10a and the fan-out area 10b will not be formed. If a plurality of line patterns arranged in the first direction are used as the assistant patterns, an unnecessary linear pattern will be formed in the fan-out area 10b close to the boundary between the dense-line area 10a and the fan-out area 10b, and the problem of dummy pattern or print out will occur. If a plurality of line patterns arranged in the second direction but not in contact with the strip pattern (such as 102a in FIG. 1) are used as the assistant patterns, since the area between the strip pattern and such assistant pattern is irradiated with strong light, the first linear pattern 400a that is the closest to the boundary between the dense-line area 10a and the fan-out area 10b is collapsed.

FIG. 5A to FIG. 5E are schematic top views showing a manufacturing process of a line structure for fan-out circuit according to a second embodiment of the disclosure.

Figure 5A:
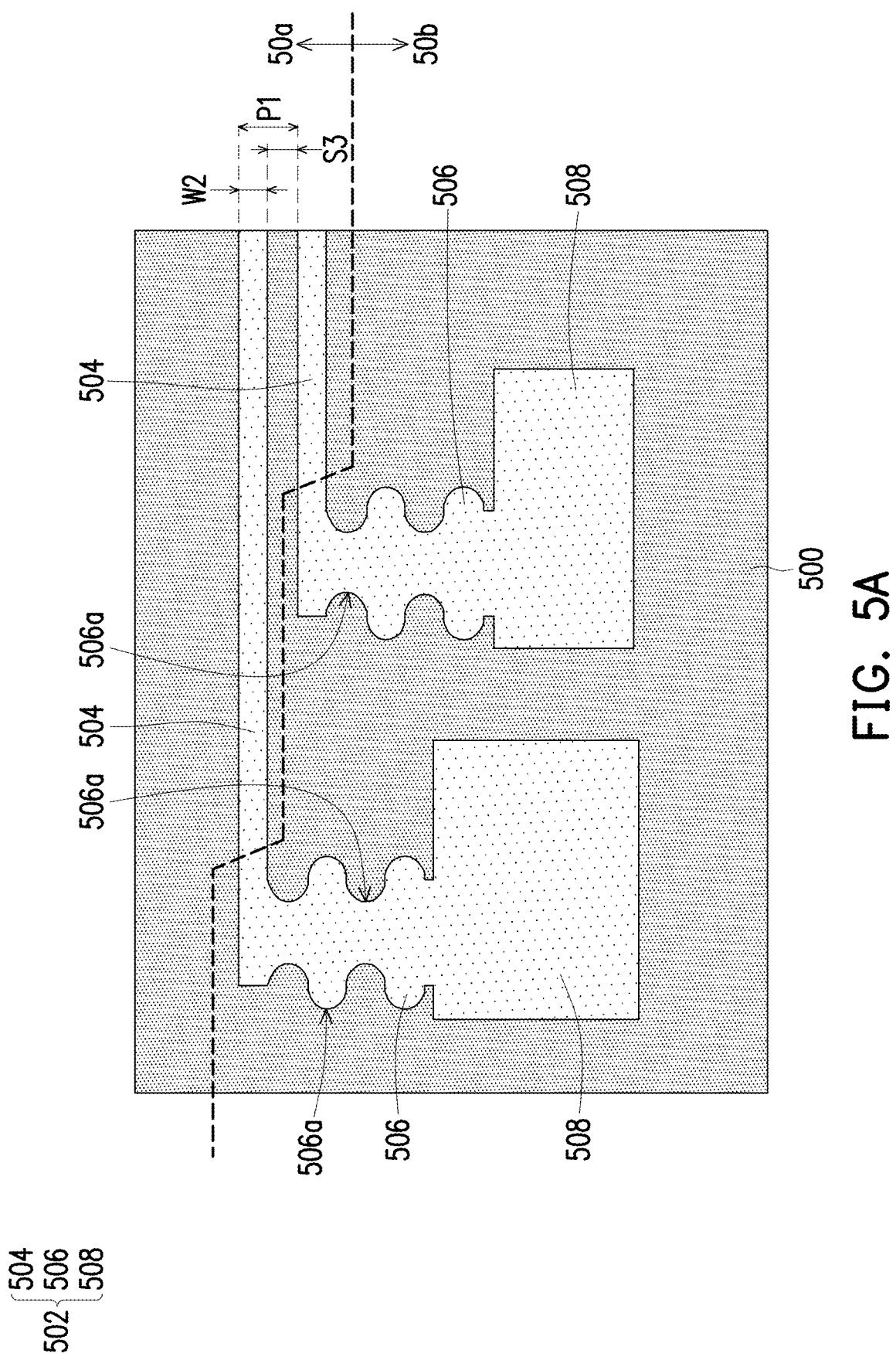
FIG. 5A to FIG. 5E are schematic top views showing a manufacturing process of a line structure for fan-out circuit according to a second embodiment of the disclosure.
Figure 6A:
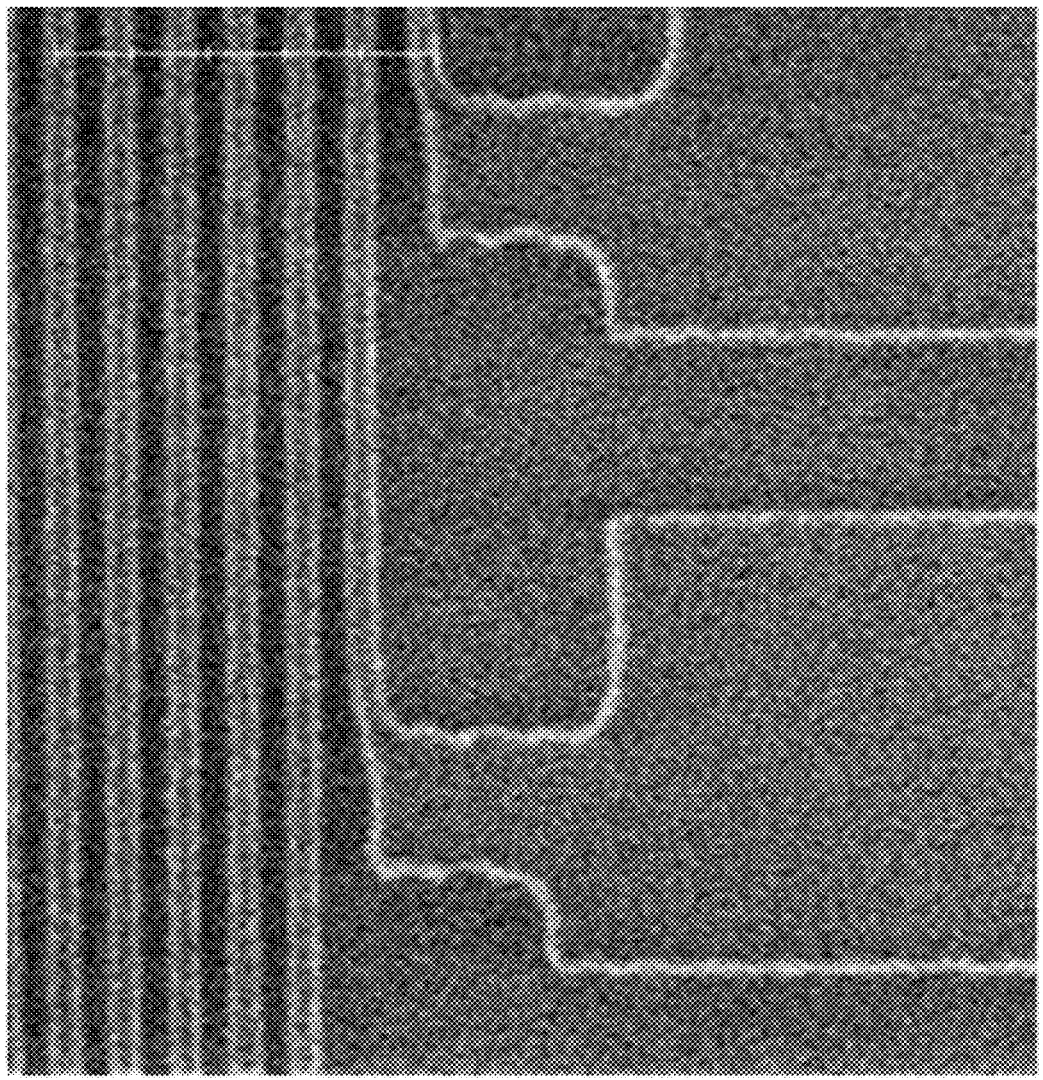
FIG. 6A is a scanning electron microscope (SEM) image of a patterned photoresist layer obtained by exposure and development using the photomask pattern of FIG. 4.
Figure 6B:
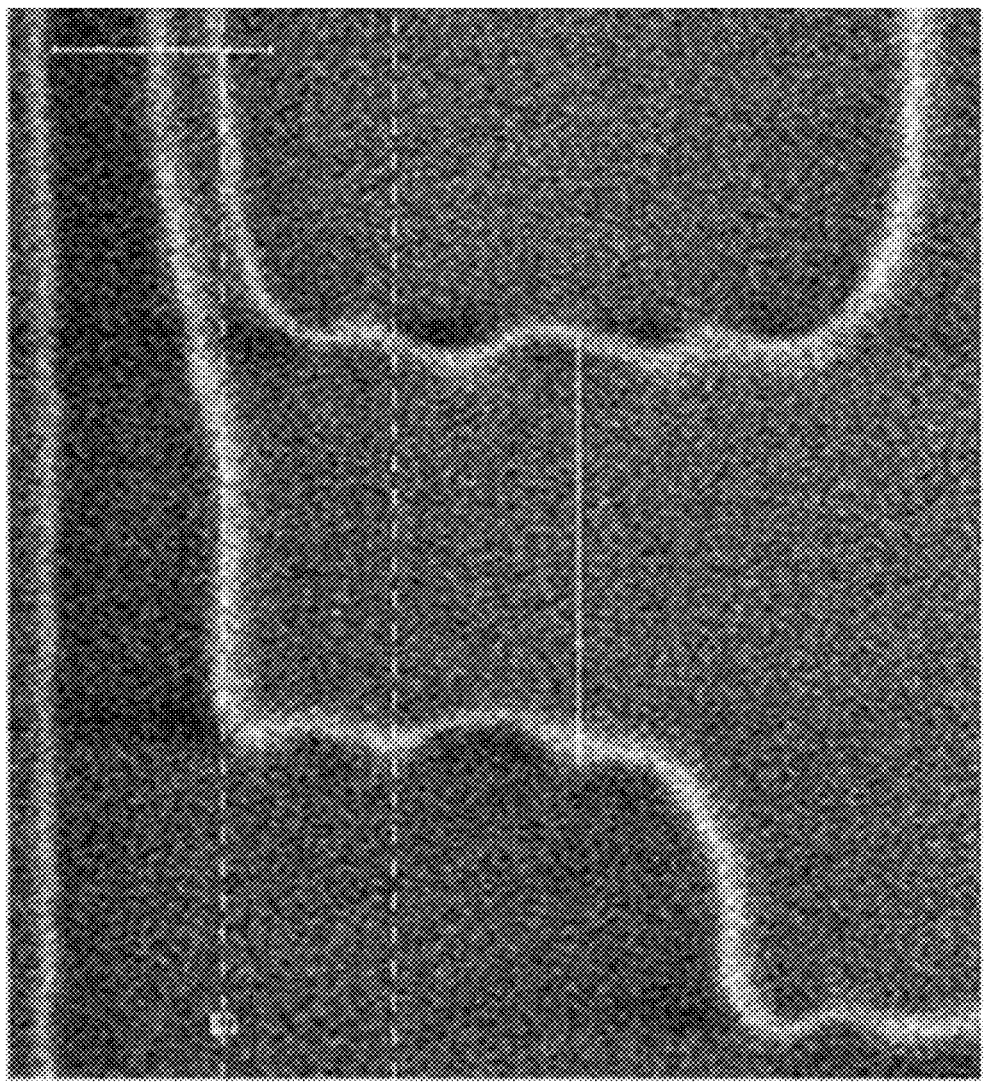
FIG. 6B is an enlarged view of a portion of FIG. 6A.

Referring to FIG. 5A, a conductive layer (not shown) is first formed on a sacrificed layer 500, and then a patterned photoresist layer 502 is formed on the sacrificed layer 500. The method of forming the patterned photoresist layer 502 is performed by, for example, using an exposure light source having a greater intensity in a second direction than in a first direction with coordination of the photomask pattern in the first embodiment to increase the process window. Accordingly, the patterned photoresist layer 502 includes a plurality of first linear patterns 504 arranged in a dense-line area 50a parallel to the first direction and a plurality of second linear patterns 506 arranged in a fan-out area 50b parallel to the second direction. At least one side of the second linear patterns 506 has a wavy side profile 506a. In this embodiment, the pitch P1 of the first linear pattern 504 is between 70 nm and 90 nm, the width W2 of the first linear pattern 504 is, for example, between 35 nm and 50 nm, and the spacing S3 between the first linear patterns 504 is, for example, between 20 nm and 55 nm, but the present disclosure is not limited thereto. To adapt to various layout designs of components, the dimension designs of the first linear pattern 504 may be changed. Although two first linear patterns 504 and two second linear patterns 506 are shown in the drawings, it should be understood that the dense-line area 50a for fan-out circuit has a plurality of first linear patterns 504 that are highly dense, and the fan-out area 50b corresponding to the first linear patterns 504 also has a plurality of second linear patterns 506. In addition, the patterned photoresist layer 502 may also include a block pattern 508 parallel to the second direction for subsequently forming the line extensively connecting to the pad. In this embodiment, the first direction is perpendicular to the second direction. For example, FIG. 6A is a scanning electron microscope (SEM) image of a patterned photoresist layer obtained by exposure and development with strong light intensity in the second direction using the photomask pattern of FIG. 4. FIG. 6B is an enlarged view of a portion of FIG. 6A. It can be clearly seen from FIG. 6B that the lateral side of the linear pattern is wavy.

Figure 5B:
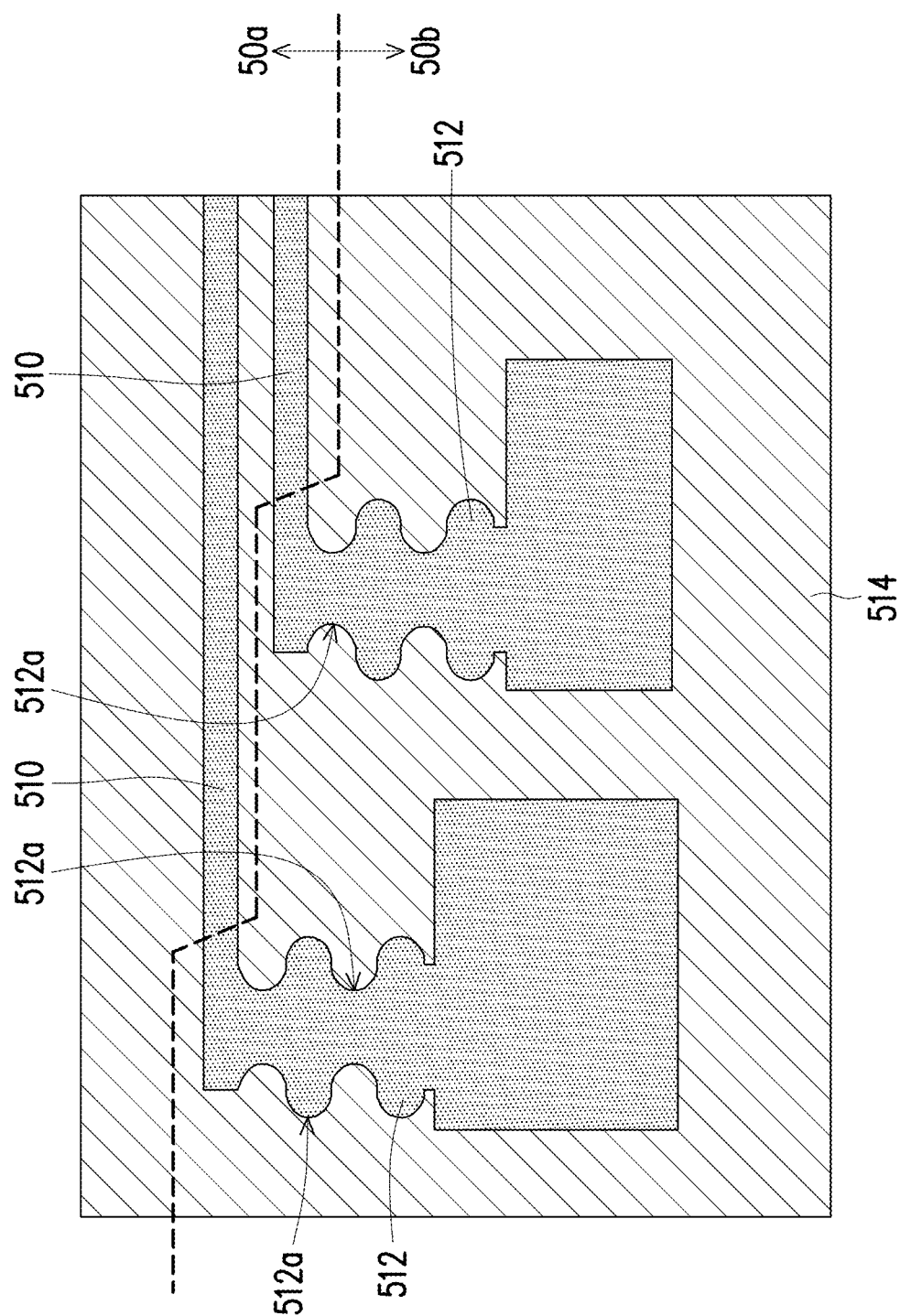

Then, referring to FIG. 5B, the first linear patterns 504 and the second linear patterns 506 are transferred to the sacrificed layer 500 to form a plurality of first lines 510 and a plurality of second lines 512 and expose the underlying conductive layer 514. At least one sidewall 512a of the second lines 512 is also exhibited in a wave shape similar to the wavy side profile 506a of the second linear pattern 506. The method of transferring pattern is performed by, for example, using the patterned photoresist layer 502 as the mask, etching the exposed sacrificed layer 500, and removing the patterned photoresist layer 502.

Figure 5C:
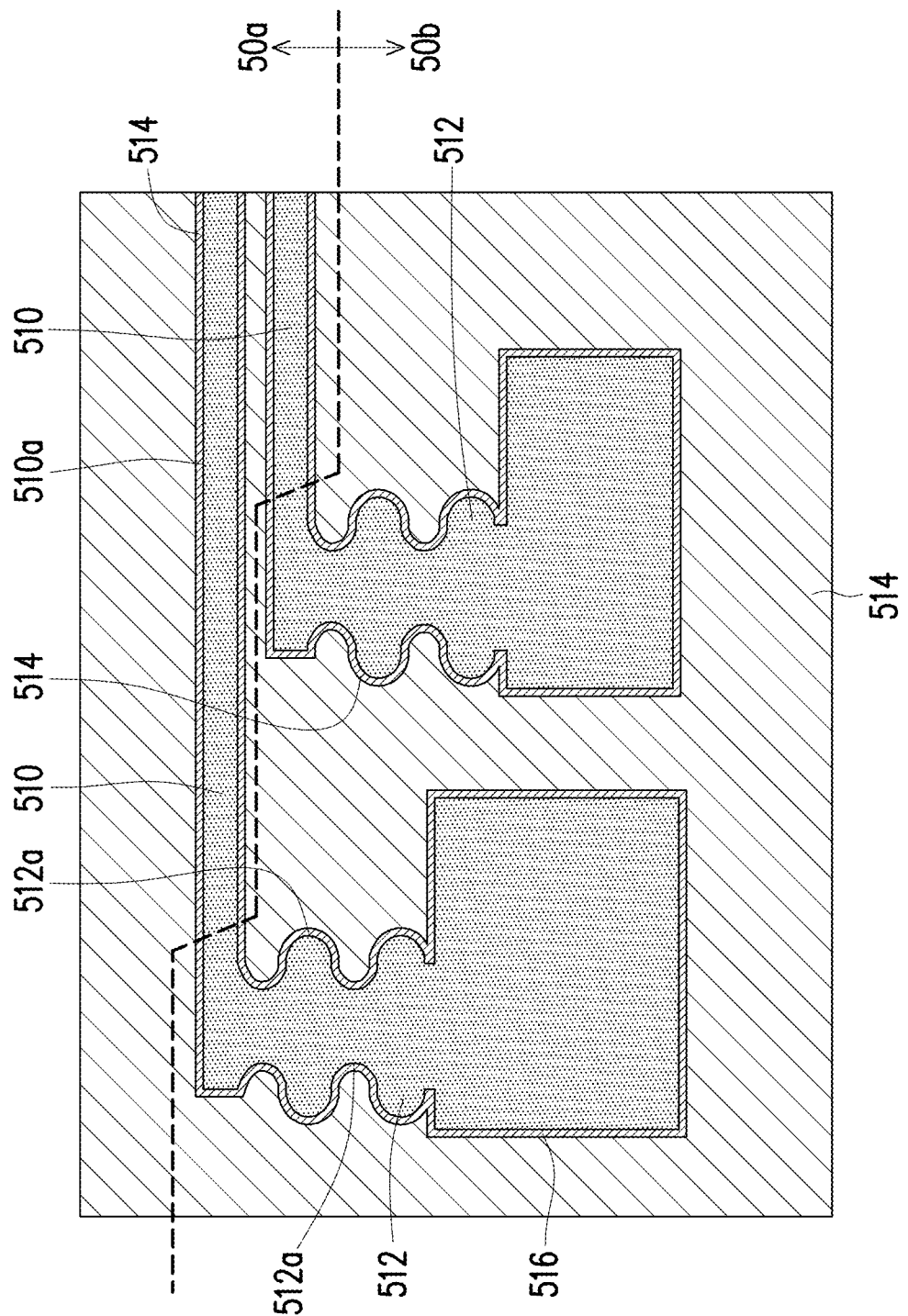

Next, referring to FIG. 5C, a spacer 516 is formed on the sidewall 510a of each of the first lines 510 and the at least one sidewall 512a of the second lines 512. The method of forming the spacer 516 includes, for example, depositing a material layer (not shown) covering the entire first line 510 and the second line 512, and etching back the material layer until the spacer 516 is formed. The material of the spacer 516 is, for example, polysilicon, silicon oxide, silicon nitride, or the like.

Figure 5D:
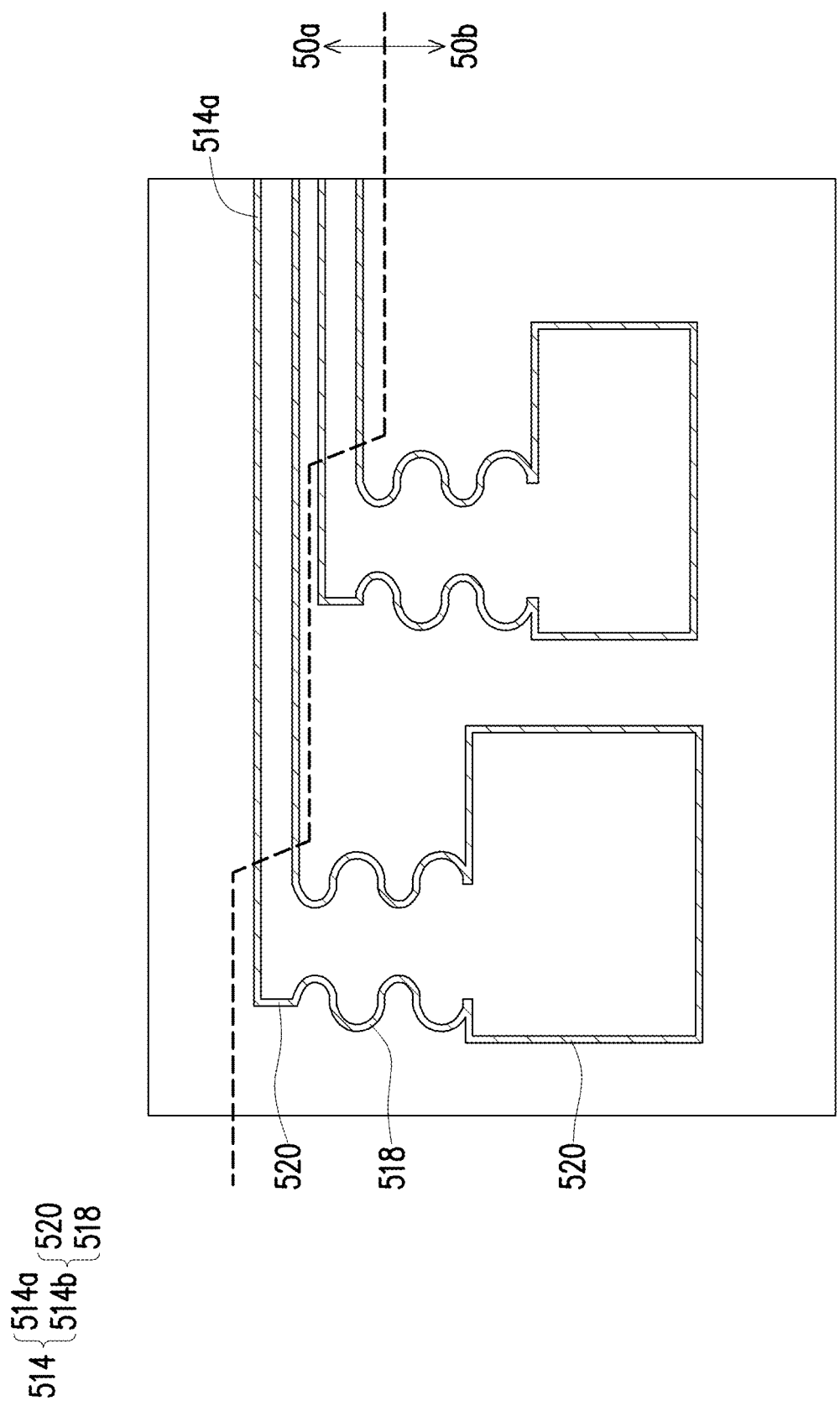

Subsequently, referring to FIG. 5D, the first line 510 and the second line 512 are removed. By using the spacer 516 in FIG. 5C as mask, the exposed conductive layer 514 is etched, such that the conductive layer 514 becomes a plurality of dense lines 514a in the dense-line area 50a and a plurality of connecting lines 514b in the fan-out area 50b, wherein at least one of the connecting lines 514b is a wavy line 518. In addition, the connecting line 514b also includes a straight line 520 or a curved line other than the wavy line 518. Afterwards, the spacer 516 is removed. Since at least one of the connection lines 514b is a wavy line 518, it means that a photomask pattern having a specific assistant pattern is used, and thereby the process window can be increased, and the problems such as photoresist peeling or print out are less likely to occur, and it also can avoid the formation of dummy patterns in the desired structure.

Figure 5E:
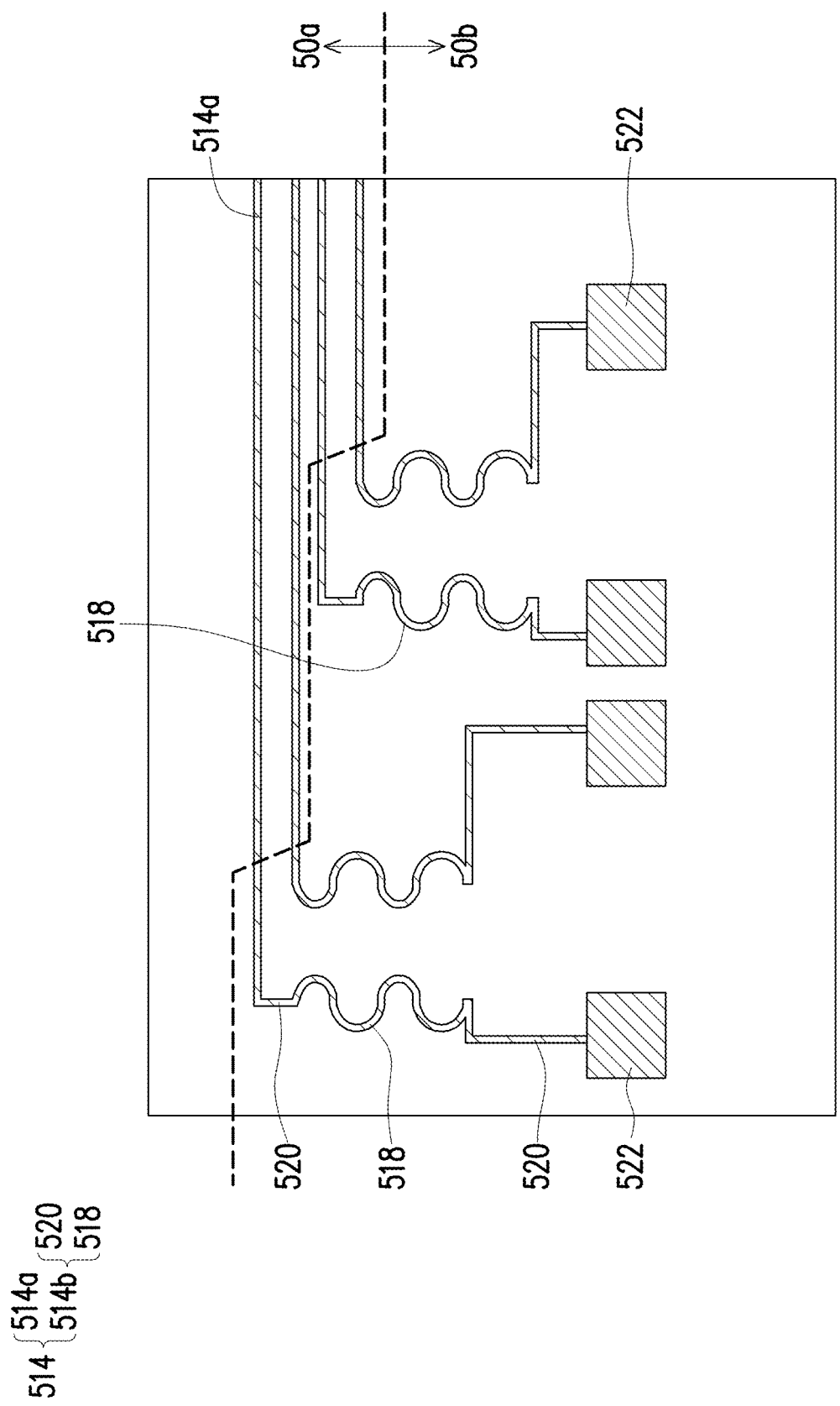

Thereafter, referring to FIG. 5E, a plurality of pads 522 may be optionally formed in the fan-out area 50b, and each of the pads 522 is respectively connected to one connecting line 514b. For example, the partially connected connecting lines 514b are first separated by a technique such as etching, and the pad 522 is formed by performing evaporation, plating, or printing at the end of each of the connecting lines 514b. However, the disclosure is not limited thereto; the design and fabrication of the above-mentioned pad 522 may also adopt other known art, and are not described herein.

Figure 7:
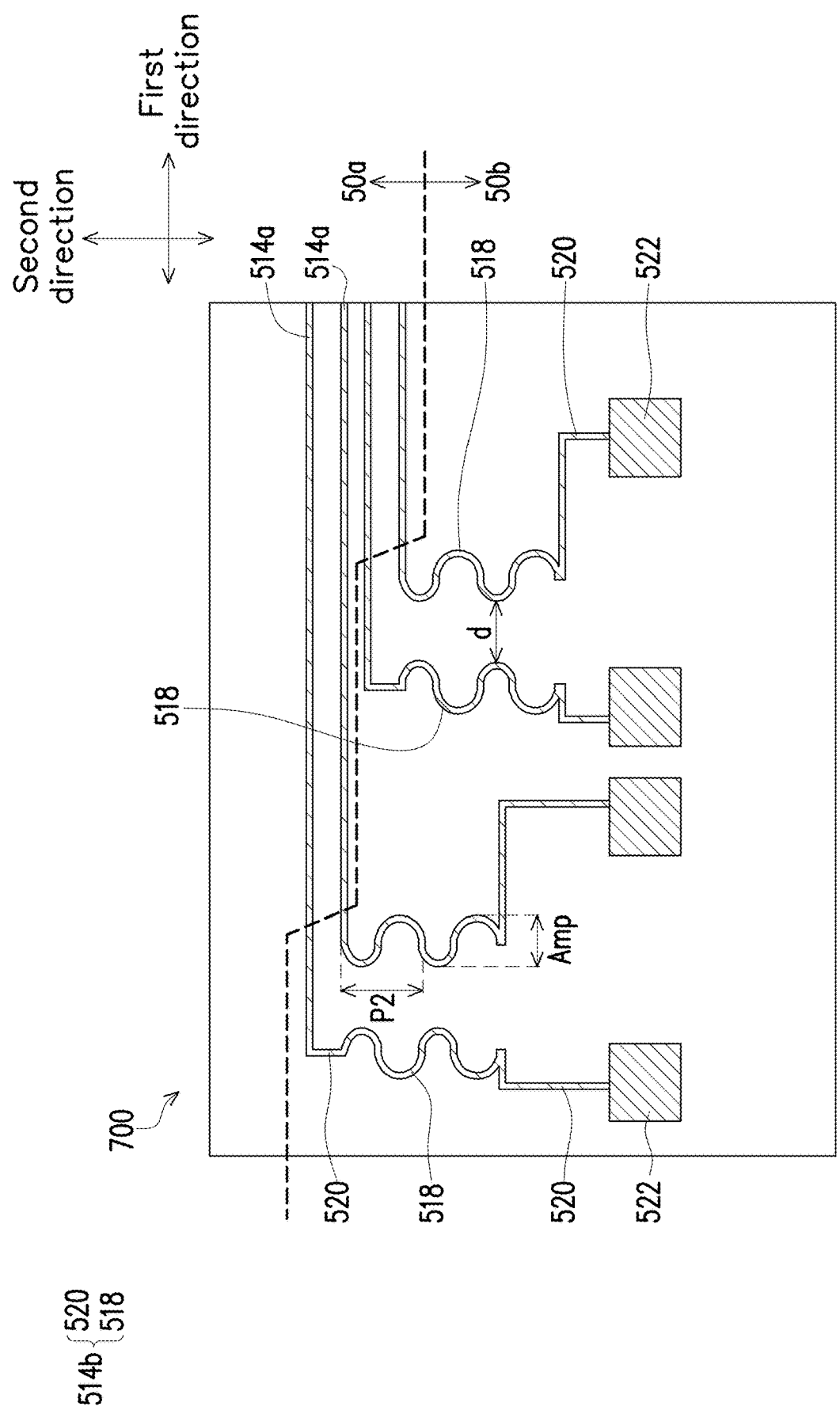
FIG. 7 is a schematic top view showing a line structure for fan-out circuit according to a third embodiment of the disclosure.

FIG. 7 is a schematic top view showing a line structure for fan-out circuit according to a third embodiment of the disclosure, wherein the same or similar components are denoted by the reference numerals in FIG. 5E, and the description of the same components can be derived from the above second embodiment and thus is not repeated herein.

Referring to FIG. 7, the line structure 700 for fan-out circuit of the third embodiment includes a plurality of dense lines 514a, a plurality of pads 520, and a plurality of connecting lines 514b. The dense lines 514a are arranged in a dense-line area 50a parallel to a first direction, the pads 522 are arranged in the fan-out area 50b, and the connecting lines 514b are arranged in a fan-out area 50b parallel to a second direction, and one connecting line 514b connects one dense line 514a with one pad 522, wherein at least one of the connecting lines 514b is a wavy line 518. In the present embodiment, the pitch P2 of the wavy line 518 is, for example, between 70 nm and 90 nm; and the amplitude Amp of the wavy line 518 is, for example, between 20 nm and 40 nm. Since the wavy line 518 is caused by the interference and diffraction of light as a result of the design of the assistant pattern in the photomask pattern, the pitch P2 and the amplitude Amp of the wavy line 518 are also changed due to the design of different assistant patterns in the photomask pattern. Additionally, the connecting line 514b also includes a straight line 520 or a curved line other than the wavy line 518 depending on the line design for circuit.

In FIG. 7, the shape of the wavy line 518 in the two adjacent connecting lines 514b is mirror symmetrical. Moreover, the minimum distance d between the two adjacent connecting lines 514b is, for example, between 150 nm and 200 nm. However, the shape, position and size of the wavy line 518 may be changed to adapt to different component size designs and different exposure and development processes.

For example, the shape of the wavy line in the two adjacent connecting lines may be asymmetrical by using the patterned photoresist layer of FIG. 6A in the manufacturing process of the second embodiment.

Figure 8:
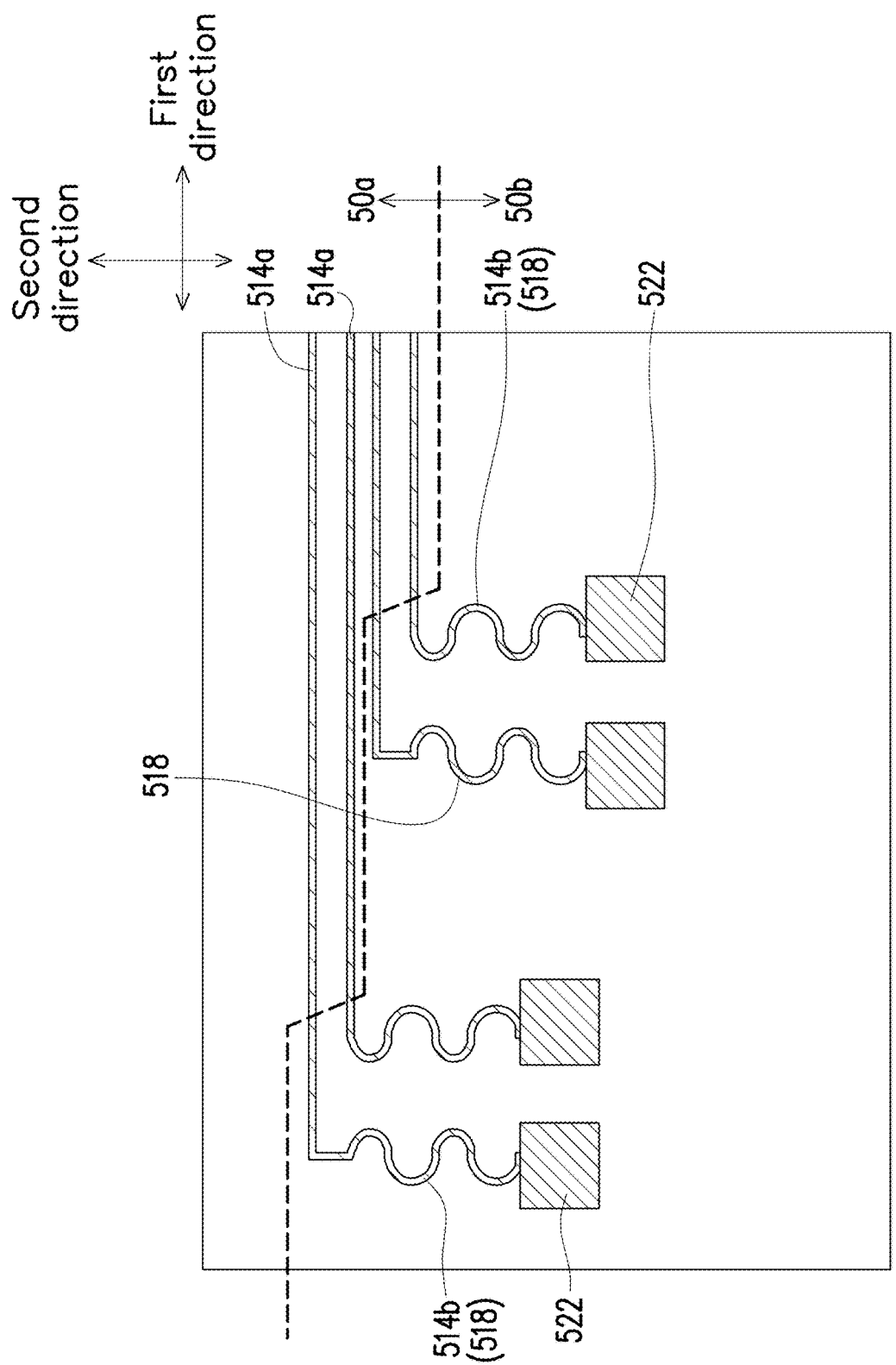
FIG. 8 is a schematic top view showing a line structure for another fan-out circuit of the third embodiment.

FIG. 8 is a schematic top view showing a line structure for another fan-out circuit of the third embodiment, wherein the same or similar components are denoted by the reference numerals in FIG. 7, and the description of the same components can be derived from the related descriptions in FIG. 7 and thus is not repeated herein.

In FIG. 8, the connecting line 514b only has the wavy line 518, so one dense line 514a and one pad 522 are connected by the wavy line 518.

In summary, the disclosure uses a photomask pattern having a specific assistant pattern to expand the process window for the manufacturing process of the line for fan-out circuit, thereby forming a line with a specific topography to connect the pads in the fan-out area with the dense lines in the dense-line area. Meanwhile, since the process window is large, it is not easy to cause problems such as peeling or print out in photoresist, and it is possible to prevent formation of dummy patterns in the structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A line structure for fan-out circuit, the fan-out circuit having a dense-line area and a fan-out area, the line structure comprising:
   a plurality of dense lines, arranged in the dense-line area, extending parallelly to a first direction;
   a plurality of pads, located in the fan-out area; and
   a plurality of connecting lines, arranged in the fan-out area, extending parallelly to a second direction perpendicular to the first direction, and respectively connecting one of the plurality of dense lines and one of the plurality of pads, wherein at least one of the connecting lines is a wavy line, and peaks of the wavy line form a line that is parallel to the second direction.

2. The line structure for fan-out circuit of claim 1, wherein a shape of the wavy line in the two adjacent connecting lines is mirror symmetrical.

3. The line structure for fan-out circuit of claim 1, wherein a shape of the wavy line in the two adjacent connecting lines is asymmetrical.

4. The line structure for fan-out circuit of claim 1, wherein a minimum distance between the two adjacent connecting lines is 150 nm to 200 nm.

5. The line structure for fan-out circuit of claim 1, wherein a pitch of the wavy line is 70 nm to 90 nm.

6. The line structure for fan-out circuit of claim 1, wherein an amplitude of the wavy line is 20 nm to 40 nm.

* * * * *